(12) United States Patent
Tan et al.

(10) Patent No.: US 9,991,209 B2
(45) Date of Patent: Jun. 5, 2018

(54) GUARD STRUCTURE FOR SIGNAL ISOLATION

(71) Applicants: THALES SOLUTIONS ASIA PTE LTD., Singapore (SG); CNRS—CENTRE NATIONAL DE LA RECHERCHE SCIENTIFIQUE (EPST), Paris (FR); NANYANG TECHNOLOGICAL UNIVERSITY, Singapore (SG)

(72) Inventors: Dunlin Tan, Singapore (SG); Jong Jen Yu, Singapore (SG); David Hee, Singapore (SG); Beng Kang Tay, Singapore (SG); Dominique Baillargeat, Limoges (FR)

( * ) Notice: Subject to any disclaimer, the term of this patent is extended or adjusted under 35 U.S.C. 154(b) by 0 days. days.

(21) Appl. No.: 15/034,679

(22) PCT Filed: Oct. 7, 2014

(86) PCT No.: PCT/SG2014/000470
§ 371 (c)(1),
(2) Date: May 5, 2016

(87) PCT Pub. No.: WO2015/069184
PCT Pub. Date: May 14, 2015

(65) Prior Publication Data
US 2016/0293554 A1 Oct. 6, 2016

(30) Foreign Application Priority Data
Nov. 6, 2013 (SG) ................. 201308325-8

(51) Int. Cl.
*H01L 23/552* (2006.01)
*B82Y 10/00* (2011.01)
(Continued)

(52) U.S. Cl.
CPC ............ *H01L 23/552* (2013.01); *B82Y 10/00* (2013.01); *H01L 23/3677* (2013.01);
(Continued)

(58) Field of Classification Search
CPC ...................... H01L 23/552; H01L 2924/3025
(Continued)

(56) References Cited

U.S. PATENT DOCUMENTS 6,137,693 A 10/2000 Schwiebert et al.
6,232,668 B1 3/2001 Hikita et al.
(Continued)

OTHER PUBLICATIONS

I. Bahl; Lumped Elements for RF and Microwave Circuits; pp. 291-299; 2003.

(Continued)

*Primary Examiner* — Marcos D Pizarro
*Assistant Examiner* — Antonio Crite
(74) *Attorney, Agent, or Firm* — Renner Kenner Greive Bobak Taylor & Weber

(57) ABSTRACT

A method of fabricating an electrical guard structure for providing signal isolation is provided. The method includes providing a substrate having a mounting surface comprising a first area for hosting at least one electronic component. The method further comprises synthesizing a plurality of thread-like structures over the substrate to collectively form one or more electrically conductive projections extending transverse to the mounting surface. The one or more electrically conductive projections include one or more wall-like structures which are elongate parallel to the mounting surface. The electrically conductive projections can be transferred to another surface such as a major surface of a second substrate. There are further provided a support structure and a (Continued)

guard structure having the wall-like electrically conductive projections which are electrically grounded when in use to provide signal isolation.

19 Claims, 5 Drawing Sheets

(51) Int. Cl.
    *H01L 23/498*     (2006.01)
    *H01L 23/66*     (2006.01)
    *H01L 25/065*     (2006.01)
    *H01L 25/16*     (2006.01)
    *H01L 29/41*     (2006.01)
    *H05K 9/00*     (2006.01)
    *H01L 23/367*     (2006.01)
    *H01L 23/373*     (2006.01)
    *H01L 23/538*     (2006.01)
    *H01L 23/04*     (2006.01)
    *H01L 23/00*     (2006.01)
    *H01L 29/06*     (2006.01)

(52) U.S. Cl.
    CPC ...... *H01L 23/373* (2013.01); *H01L 23/49827* (2013.01); *H01L 23/49838* (2013.01); *H01L 23/49877* (2013.01); *H01L 23/5384* (2013.01); *H01L 23/5385* (2013.01); *H01L 23/66* (2013.01); *H01L 24/17* (2013.01); *H01L 24/32* (2013.01); *H01L 24/48* (2013.01); *H01L 24/73* (2013.01); *H01L 25/0652* (2013.01); *H01L 25/0655* (2013.01); *H01L 25/0657* (2013.01); *H01L 25/16* (2013.01); *H01L 29/413* (2013.01); *H05K 9/0022* (2013.01); *H01L 23/04* (2013.01); *H01L 24/16* (2013.01); *H01L 29/0676* (2013.01); *H01L 2223/6616* (2013.01); *H01L 2223/6683* (2013.01); *H01L 2224/16225* (2013.01); *H01L 2224/16227* (2013.01); *H01L 2224/16235* (2013.01); *H01L 2224/32165* (2013.01); *H01L 2224/32225* (2013.01); *H01L 2224/48091* (2013.01); *H01L 2224/48106* (2013.01); *H01L 2224/48227* (2013.01); *H01L 2224/73265* (2013.01); *H01L 2225/0651* (2013.01); *H01L 2225/06517* (2013.01); *H01L 2225/06548* (2013.01); *H01L 2225/06572* (2013.01); *H01L 2924/00014* (2013.01); *H01L 2924/01006* (2013.01); *H01L 2924/14* (2013.01); *H01L 2924/1421* (2013.01); *H01L 2924/1423* (2013.01); *H01L 2924/157* (2013.01); *H01L 2924/3025* (2013.01)

(58) Field of Classification Search
    USPC ... 257/659, 729, 746, 787, E51.04, E51.038, 257/679
    See application file for complete search history.

(56) References Cited

U.S. PATENT DOCUMENTS

| | | | |
|---|---|---|---|
| 8,102,032 B1 | 1/2012 | Bolognia et al. | |
| 8,199,518 B1 | 6/2012 | Chun et al. | |
| 2004/0233649 A1 | 11/2004 | Honlein et al. | |
| 2009/0114890 A1* | 5/2009 | Imholt | C09D 7/1291 252/587 |
| 2009/0166819 A1* | 7/2009 | Chen | B82Y 30/00 257/659 |
| 2010/0243295 A1* | 9/2010 | Allemand | B82Y 10/00 174/250 |
| 2010/0261343 A1 | 10/2010 | Mizukoshi et al. | |
| 2011/0039459 A1 | 2/2011 | Yancey | |
| 2011/0222717 A1* | 9/2011 | Kuratani | H04R 19/005 381/355 |
| 2014/0015158 A1* | 1/2014 | Cola | B01J 23/745 264/81 |
| 2014/0239464 A1* | 8/2014 | Chung | H01L 23/60 257/659 |

OTHER PUBLICATIONS

D.D.L. Chung; Carbon materials and structural self-sensing, electromagnetic shielding and thermal interfacing; www.sciencedirect.com; Carbon 50 (2012) pp. 3342-3353; Jan. 31, 2012.
Chin Chong Yap, et al.; Characterization of CNT Interconnection Bumps Implemented for 1st Level Flip Chip Packaging; 2011 13th Electronics Packaging Technology Conference; 2011; pp. 195-198.
D.D.L. Chung; Electromagnetic interference shielding effectiveness of carbon materials; Carbon 39 (2001) pp. 279-285; 2001 Elsevier Science Ltd.
Asanee Suntives, et al; Using via fences for crosstalk reduction in PCB circuits; pp. 34-37; 2006.
IOPScience.iop.org; Fabrication of epoxy spherical microstructures by controlled drop-on-demand inkjet printing; pp. 1-8; 2012.
Chin Chong Yap,et al.; Carbon nanotube bumps for the flip chip packaging system; http://www.nanoscalereslett.com/content/7/1/105; 2012; 8 Pages.
George E. Ponchak, et al.; The use of metal filled via holes for improving isolation in LTCC RF and wireless multichip packages; IEEE Transactions on Advanced Packaging, vol. 23, No. 1; Feb. 2000. pp. 88-99.
Brian Curran, et al.; Novel multimodal high-speed structures using substrate integrated waveguides with shielding walls in thin film technology; 2008; pp. 206-209.
Ikuo Soga, et al.; Carbon nanotube bumps for LSI Interconnect; 2008; pp. 1390-1394.
Sascha Hermann, et al.; Microelectronic Engineering; Journal homepage www.elsevier.com/locate/mee; pp. 438-442; 2009.
Vladimir A. Labunov, et al.; Microwave Frequency Characteristics of magnetically functionalized carbon nanotube arrays; IEEE Transactions on electromagnetic compatibility, vol. 54, No. 1 Feb. 2012—pp. 70-80.
Igor Maria De Rosa, et al. EMC impact of advanced carbon fiber/carbon nanotube reinforced composites for next-generation aerospace applications; IEEE Transactions on electromagnetic compatibility, vol. 50, No. 3 Aug. 2008; pp. 556-563.

* cited by examiner

GUARD STRUCTURE FOR SIGNAL ISOLATION

FIELD OF INVENTION

This invention involves the implementation of an electrical guard structure for signal isolation in electronic circuitry such as integrated circuits (ICs), or between IC packages or other electronic components on a substrate such as a printed circuit board. The invention can be used in, but is not limited to, Microwave Monolithic Integrated Circuits (MMIC), Multiple Chip Module (MCM), System-in-Package (SiP), System-on-Package (SoP), and Integrated Circuit Electromagnetic Interference/Compatibility (IC EMI/EMC) solutions.

BACKGROUND OF INVENTION

The integration of digital and RF components in densely routed architectures requires careful layout design to ensure adequate DC or mixed-signal isolations in compliance with specifications for a particular application. To meet the emerging need to downscale complex multifunctional integrated circuit packages, layout routing techniques, packaging design and isolation methods have become very critical design considerations [1], [2].

Currently, common practices are set to place different electronic components including signal traces, circuits and conductors physically apart so as to minimize Electromagnetic (EM) coupling. Additional measures including via-fencing and metal castings or walls are also employed to improve EM isolation. For example, in conventional Monolithic Microwave Integrated Circuit (MMICs) or Radio-Frequency (RF) packages, guard traces and via-fences are used to protect the mixed-signal traces/packages from stray radiation.

Via-fencing is a technique used for RF isolation by extending the ground plane up to the plane of the IC that contains the mixed-signal traces. Specifically, the ground trace on the ground plane is coupled to the guard trace on the plane of the IC using vias extending through the substrate. The vias may be metal-lined or metal-filled to effectively connect the guard trace to the ground plane. Depending on RF isolation requirements, via-fences with a suitable catch pad can be designed with various sizes and dimensions. Design rules for such structures are well known. For example, the design rules are correlated to a few factors, such as the physical and material properties of the substrate (e.g. relative permittivity, thickness), and design requirements (e.g. width of the signal traces). The database for such design rules is also well known [3].

Although the via-fencing technique is known to be effective in RF isolation, its use is limited to packages or ICs without space constraints. In particular, there is a minimal amount of space required between the via-fenced guard trace and the signal trace before good isolation between the signal traces or ICs can be achieved and the signal integrity can be maintained [3], [4]. Therefore, this solution has limitations for designs with limited real estate and/or tightly coupled mixed-signal traces or ICs in close proximity. This problem becomes even more prominent in high speed applications and/or high density circuitries.

The second technique involves mounting and aligning metal castings or walls to surround the electronic components/ICs on the substrate and compartmentalize the various electronic components fabricated/mounted on the substrate. The metallic walls may screen stray electromagnetic radiation and provides mechanical protection for the package. However, to date such metallic walls can only be built separately by casting or molding [5]. The metallic walls are then assembled onto the packages such as MMICs. Existing surface micromachining techniques used in microelectronic processes are generally not available to build such metallic walls because those techniques usually have very limited build-up thickness for metals. For example, solid metallic walls structures with a high aspect ratio (i.e. height/thickness of the wall), such as metal pillars having an aspect ratio greater than two, are not achievable by existing surface micromachining techniques used in microelectronics processes.

Accordingly, surface-mounting (conventional or flip-chip) or cavity-mounting are typically required for MMIC hybrid assemblies. In additional, complex alignment procedures and bonding techniques are usually necessary which lead to increased costs. More importantly, the post design integration of metal castings or walls often requires large space allowances for placement, which is undesirable for space-efficient considerations. In all, it is not cost effective to carry out both a post-mounting/alignment process of metal castings for EM shielding, and to customize individual molds of metal castings for different partitioning designs.

In summary, the existing solutions for providing good electrical isolation in a highly compact device are far from satisfactory. Via fences are used to surround the signal traces or ICs to reduce stray radiation. However, this method is not space and cost effective for implementing miniaturized multifunctional designs, especially for high speed signals. Metal castings are used to partition the components mechanically and protect them from unwanted EM interferences. However, the processes of mounting and aligning such metal castings are costly, complex and require buffer mounting areas, which again, is not space and cost efficient.

SUMMARY OF THE INVENTION

To suit the current and future needs of multi-functional devices that are compact and yet have desired signal integrity, the present invention proposes a novel RF isolation structure and fabrication techniques to address the above problems with existing solutions.

In general terms, this invention proposes an electrical guard structure for providing electrical isolation in electronic circuitry such as integrated circuits (ICs), or between IC packages or other electronic components on a substrate such as a printed circuit board (PCB) or a printed wiring board (PWB), and its fabrication methods. The guard structure includes a plurality of electrically conductive projections extending transverse to a major surface of the substrate. The electrically conductive projections are formed by collections of a plurality of thread-like structures.

This invention may be implemented at the substrate level and/or at the package level. That is, at the substrate-level, the guard structure minimizes stray radiation to maintain good signal integrity between signal traces, resistors, inductors, capacitors, circuitries, etc; at the package level, the guard structure provides electrical isolation between adjacent packages such as IC packages. Additionally, the guard structure may provide structural support for the packages, especially for a three dimensional/stack IC packages.

According to a first aspect, there is proposed a method of fabricating an electrical guard structure for providing signal isolation, comprising the steps of:

providing a substrate having a mounting surface comprising a first area for hosting the at least one electronic component; and synthesizing a plurality of thread-like structures over the mounting surface of the substrate to collectively form one or more electrically conductive projections extending, transverse to the mounting surface;

wherein the one or more electrically conductive projections include one or more wall-like structures;

wherein the one or more wall-like structures are elongate parallel to the mounting surface.

The present method is advantageous because it allows for the electrically conductive projection to be synthesized directly over the substrate itself. Unlikely existing practice, such as mounting the metallic casting onto the IC packages, the present method does not require post assembly of the guard structure. Specifically, the synthesizing step can be performed by conventional surface machining techniques used in microelectronic process and thus can be integrated to the process of IC package fabrication itself. Moreover, the wall-like structures, which are elongate parallel to the mounting surface, function as "fence-walls" for undesired signal interference and allow electromagnetic shielding to be achieved effectively.

Therefore, it allows the designers to take specific isolation requirements into routing design considerations and thus providing them with additional design flexibility. At the same time, the isolation structures can be customized according to different isolation requirement and targeted at the source of stray radiation. As will be explained further in the detailed description, this leads to significant improvement in the cost-effectiveness of the fabrication process and enhanced isolation performance.

Additionally, the plurality of thread-like structures gives rise to an increased surface-to volume ratio of the electrically conductive projections. This leads to an enhanced capability in absorbing radiation.

Accordingly to a particular example, each of said wall-like structures has a length in a lengthwise direction and a thickness perpendicular to the lengthwise direction. The ratio of the length and thickness is greater than 2.

According to another example, the ratio of the length and thickness is greater than 1.5.

According to yet another example, the ratio of the length and thickness is greater than 2.5.

According to yet another example, the ratio of the length and thickness is greater than 3.

According to yet another example, the ratio of the length and thickness is greater than 4.

The method of fabricating the electrical guard structure may further comprise electrically connecting the one or more wall-like structures to a ground plane. Alternatively, the one or more wall-like structures can be connected to a ground plane when in use.

Typically, the step of synthesizing includes forming the plurality of thread-like structures with an aspect ratio of greater than 10. This is advantageous because it would allow a relatively high aspect ratio of the resulting electrically conductive projections to be achieved. A high aspect ratio of the electrically conductive projections means enhanced signal isolation along the vertical direction for the same amount of substrate space occupied by the projection.

Typically, the one or more electrically conductive projections have an aspect ratio of at least 2. For example, the aspect ratio can be in a range of 2-25. Optionally, the aspect ratio is in a range of 2-18. In one example, the aspect ratio is at least 3. In another example, the aspect ratio is at least 3.5. In yet another example, the aspect ratio is at least 5.

In a preferred embodiment, each of the wall-like structures extends transversely from the mounting surface by a predefined height and the ratio of the height and the thickness is at least 2.

Advantageously, the high aspect ratio of the electrically conductive projections enhances isolation in the vertical direction through "channelizing" mixed signal/power traces, which is especially valuable in routing architectures with tight space constraints. As a result of this enhanced vertical isolation, the size requirements on guard traces for lateral isolations can be further reduced.

As noted earlier, the high aspect ratio of the electrically conductive projections may be achieved by synthesizing a plurality of thread-like structure over the substrate itself. In one embodiment, the plurality of thread-like structures are synthesized directly on the substrate itself, e.g. on a $SiO_2$ wafer.

In another embodiment, the plurality of thread-like structures are synthesized on one or more electrically conductive portions (such as on via-fenced guard traces) on the mounting surface of the substrate.

For example, the one or more electrically conductive portions are formed by a layer of electrically conductive material selectively disposed on a portion of the mounting surface of the substrate. Alternatively, the electrically conductive portion may be obtained by modifying the surface characteristics of the substrate itself, for example, by selectively doping a surface of a silicon substrate and/or selectively removing a part of the surface by etching.

Preferably, the one or more electrically conductive portions are coupled to a ground plane on a surface of the substrate opposite to the mounting surface by providing a plurality of vias extending through the substrate. Typically, the one or more electrically conductive projections are positioned over the plurality of vias. In this way, the wall-like structures can be regarded as an upward extension of the via-fenced, guard trace in the vertical direction. Advantageously, the integration between wall-like structures together with the via-fence provides the surprising advantage of robust signal isolation in both the vertical and lateral directions.

Furthermore, the electrically conductive projections extending transverse to the mounting surface will be able to provide robust RF isolation in both lateral and vertical directions. This will lead to a reduction in the requirement on lateral isolation as provided conventionally by guard traces and via-fencings. This is important because then the chip area required for guard trace and via-fencing can be reduced. This makes package miniaturization possible because it allows the signal integrity to be maintained in a highly compact device.

The synthesis of the plurality of thread-like structures may be achieved by performing chemical vapor deposition on the one or more electrically conductive portions. For example, the plurality of thread-like structures may be formed of nanowires, nanofibers' or nanotubes. According to a particular example, the thread-like structures are carbon nanotubes (CNTs). The CNTs may be single-walled and/or multi-walled. According to a particular example, the CNTs are double-walled.

Advantageously, the CNTs can be formed with a very high aspect ratio using existing surface micromachining techniques in microelectronic processes. Accordingly, the electrically conductive projections formed by the CNTs will have significantly enhanced isolation capability to effectively screen off the source of stray radiation compared to the existing technologies.

Advantageously, the one or more electrically conductive portions can be prepared with catalyst particles for catalyzing the synthesis of the plurality of thread-like structures.

According to one example, the one or more electrically conductive projections are positioned surrounding said first area. In particular, depending on a particular isolation requirement, the electrically conductive projections may be designed to fully or partially surround the at least one electronic component.

According to a further example, the mounting surface comprises a second area for hosting a second electronic component, at least some of the one or more electrically conductive projections being positioned between the first and second areas.

According to a second aspect, there is provided a method of fabricating an electrical guard structure for providing signal isolation, comprising the steps of:
  providing a first substrate having a first surface for hosting at least one electronic component,
  providing a second substrate having a second surface carrying a first plurality of thread-like structures to collectively form one or more electrically conductive projections extending transverse to the second surface, and
  joining a free surface of the one or more electrically conductive projections to a pre-defined area of the first surface such that the one or more electrically conductive projections are transverse to the first surface and are electrically connected to a ground plane of the first substrate;
  wherein the one or more electrically conductive projections include one or more wall-like structures;
  wherein the one or more wall-like structures are elongate parallel to the first surface.

According to a particular example, the one or more electrically conductive projections are coupled to a ground plane on a surface of the first substrate opposite to the first surface by providing a plurality of vias extending through the first substrate. Similarly, the one or more wall-like structures can be positioned over the plurality of vias.

In one embodiment, at least a portion of the pre-defined area of the first substrate has a second plurality of thread-like structures which collectively define further electrically conductive projections extending transverse to the first surface prior to the step of joining.

Optionally, the second plurality of thread-like structures are synthesized over the first substrate itself, for example, directly on the first substrate itself or on the electrically conductive portions (such as via-fenced guard traces) of the first substrate. Alternatively, the second plurality of thread-like structures are transferred to the first substrate.

In one embodiment, the first plurality of thread-like structures are synthesized over the second surface. Alternatively, the plurality of thread-like structures are transferred to the second substrate.

In one embodiment, the method further comprises removing the second substrate from the one or more electrically conductive projections after the step of joining. For example, the second substrate may be a sacrificial substrate, which may be removed by reactive ion etching. Advantageously, this provides an alternative way to implement the electrically conductive projections onto the substrate, especially when working with the IC package substrate with thermal budget constraints.

In another embodiment, the second substrate comprises a mounting surface for an electronic component the mounting surface being opposite to the second surface. In other words, the first substrate and the second substrate can potentially form a three-dimensional functional IC package with the implementation of the electrically conductive projections. Advantageously, the electrically conductive projections between them provide not only desired signal isolation but also structural support.

Optionally, the first plurality of thread-like structures are synthesized on a ground plane of the second substrate.

In one embodiment, the first plurality of thread-like structures may be synthesized by chemical vapor deposition.

In one embodiment, the first plurality of thread-like structures comprise nanowires, nanofibers or nanotubes. According to a particular example, the first plurality of thread-like structures comprise carbon nanotubes (CNTs). The CNTs may be single-walled, double-walled and/or multi-walled. According to a particular example, the CNTs are double-walled.

In one embodiment, the one or more electrically conductive portions are coupled to the ground plane of the first substrate by providing a plurality of vias extending through the first substrate.

The one or more of the electrically conductive projections are configured to surround the at least one electronic component after the step of joining. In other words, the at least one electronic component may be fully surrounded, i.e. completely encircled, by the electrically conductive projections. Alternatively, the electrically conductive projections are configured to partially surround the at least one electronic component. Note that the term "encircle" does not imply a circular cross-section of the wall-like structure when viewed from the top of the substrate.

Preferably, at least some of the one or more electrically conductive projections are positioned between pairs of electronic components or signal traces on the first surface after the step of joining.

According to a third aspect of the invention, there is provided a support for receiving and providing signal isolation comprising:
  a substrate having a mounting surface comprising a first area for hosting at least one electronic component; and
  a plurality of thread-like structures synthesized over the mounting surface of the substrate which collectively define one or more electrically conductive projections extending transverse to the mounting surface
  wherein the one or more electrically conductive projections include one or more wall-like structures;
  wherein the one or more wall-like structures are elongate parallel to the mounting surface.

Similarly, the provision of wall-like structures which are elongate parallel to the mounting surface function as "fence-walls" for undesired signal interference and allows electromagnetic shielding to be achieved effectively.

Since the plurality of thread-like structures are synthesized directly over the mounting surface, which allows the designers to take specific isolation requirements into routing design considerations and thus providing them with additional design flexibility, the isolation structures are customized according to different isolation requirement and targeted at the source of stray radiation.

Additionally, the plurality of thread-like structures gives rise to an increased surface-to volume ratio of the electrically conductive projections. This leads to an enhanced capability in absorbing radiation.

Accordingly to a particular example, each of said wall-like structures has a length in a lengthwise direction and a thickness perpendicular to the lengthwise direction. The ratio of the length and thickness is greater than 2.

According to another example, the ratio of the length and thickness is greater than 1.5.

According to yet another example, the ratio of the length and thickness is greater than 2.5.

According to yet another example, the ratio of the length and thickness is greater than 3.

According to yet another example, the ratio of the length and thickness is greater than 4.

The method of fabricating the electrical guard structure may further comprise electrically connecting the one or more wall-like structures to a ground plane. Alternatively, the one or more wall-like structures can be connected to a ground plane when in use.

In one embodiment, the plurality of thread-like structures are synthesized on one or more electrically conductive portions (such as on via-fenced guard traces) on the mounting surface of the substrate. Preferably, the one or more electrically conductive portions are coupled to a ground plane on a surface of the substrate opposite to the mounting surface by providing a plurality of vias extending through the substrate. In this way, the wall-like structures can be regarded as an upward extension of the via-fenced guard trace in the vertical direction. Advantageously, the integration between wall-like structures together with the via-fence provides the surprising advantage of robust signal isolation in both the vertical and lateral directions.

Moreover, the electrically conductive projections extending transverse to the mounting surface will be able to provide robust RF isolation in both lateral and vertical directions. This will lead to a reduction in the requirement on lateral isolation as provided conventionally by guard traces and via-fencings. This is important because then the chip area required for guard trace and via-fencing can be reduced. This makes package miniaturization possible because it allows the signal integrity to be maintained in a highly compact device.

Typically, at least one of the electrically conductive portions has at least 80% of its area being covered by the electrically conductive projections. For example, at least one via-fenced guard trace has 80% of its area being covered by the electrically conductive projections.

Typically, the electrically conductive projections extend away from the mounting surface by a distance further than the distance that the at least one electronic component extends away from the mounting surface. Advantageously, this ensures adequate vertical isolation and may additionally serves as structural support, especially for a three-dimensional stack package.

According to a further aspect, there is provided an electrical guard structure comprising:
 a substrate having a mounting surface for hosting at least one electronic component; and
 a plurality of thread-like structures synthesized over a surface of the substrate opposite to the mounting surface, wherein the plurality of thread-like structures collectively define one or more electrically conductive projections extending transverse to the surface;
 wherein the one or more electrically conductive projections include one or more wall-like structures;
 wherein the one or more wall-like structures are elongate parallel to the surface.

Optionally, the plurality of thread-like structures are synthesized over the surface. Typically, the surface has a ground plane and the plurality of thread-like structures are synthesized over the ground plane.

The term "electronic component" in this specification refers to any basic discrete device or physical entity in an electronic system used to modify an electrical signal transmitted to it. A non-exhaustive list of electronic components includes resistors, inductors, capacitors, ICs and IC packages. Typically, an electronic circuit is made of one or more electronic components.

The term "signal trace" refers to any conductive pathway that connects two electronic components. In particular, signal trace may refer to a mixed-signal trace, a DC signal trace, a conduction line, or transmission line for electronic signals and/or power signals.

The term "ground plane" means a plane of metal usually provided on a surface of a substrate. Typically, it covers the entire area of that surface. In some cases, it covers only a portion of the surface, which may be patterned by lithography. Alternatively, the ground plane may be provided through adjacent metal pads that are not provided on a surface of a substrate but, for example, by adjacent IC packages.

The term "integrated circuit" (also referred to as an IC, a chip, or a microchip) is a set of electronic circuits or components on a small plate of semiconductor material. An IC package means a protective container housing one or more ICs.

The term "transverse to" refers to a direction that is generally perpendicular to or substantially perpendicular to.

The term "aspect ratio" describes the ratio of the height and a width or thickness of a structure. In the context of the specification, it refers to the ratio of the height and a dimension of the base of an object. In particular, the aspect ratio of an electrically conductive projection refers to the ratio of the height of the projection measured from the mounting surface and a pre-defined dimension of the base of the projection. Typically, the base has two dimensions and the pre-defined dimension is the smaller one of the two dimensions.

The term "guard trace" refers to an electrically conductive portion that is typically provided on the mounting surface of a substrate (i.e. on same plane as any signal traces or electronic components) that is electrically connected to a ground plane. Generally, a via-fenced guard trace is a guard trace that is grounded through via holes extending all the way through the substrate.

The term "substrate" means a piece of material that is suitable for hosting one or more electronic components. In particular, a substrate can be a piece of silicon wafer on which electronic circuitry (e.g. a combination of electronic components and signal traces) can be fabricated to form an IC. For another example, a substrate is a PCB or PWB on which IC packages, other electronic components and signal traces can be fabricated/mounted.

The term "synthesize a thread-like structure" means to combine atoms or molecules together to form an individual thread-like structure. The term "synthesize a plurality of thread-like structures" accordingly means to form a plurality of the thread-like structures, each of which is formed by combining atoms or molecules together. For example, a plurality of CNTs can be synthesized by performing chemical vapor deposition. For another example, a plurality of CNTs can be synthesized by performing 3D printing. The expression that "synthesize a plurality of thread-like structures on a substrate" accordingly means the process of synthesis (i.e. the process of combining combine atoms or molecules to form individual thread-like structures) is carried out on the substrate. On the other hand, if a thread-like structure or thread-like structures are merely transferred to a substrate, the thread-like structure(s) are not considered "synthesized" on that substrate.

The term "synthesize over (a surface of) a substrate" means that the synthesis is carried out directly on the surface of the substrate or carried out on a layer of material that is disposed on the surface of the substrate.

The "thread-like structures" refers to nano- or micro-structures having a high length-to diameter ratio. Typically, the structures are nano-structures and the diameter of the thread-like structures ranges from 0.01 nanometer to 500 nanometer. Preferably, the diameter ranges from 0.1-100 nanometer The present invention is suitable for applications of EM isolation in general and preferably for applications of RF isolation.

BRIEF DESCRIPTION OF DRAWINGS

It will be convenient to further describe the present invention with respect to the accompanying drawings that illustrate possible arrangements of the invention. Other arrangements of the invention are possible, and consequently the particularity of the accompanying drawings is not to be understood as superseding the generality of the preceding description of the invention.

DETAILED DESCRIPTION OF PREFERRED EMBODIMENTS

Figure 1:
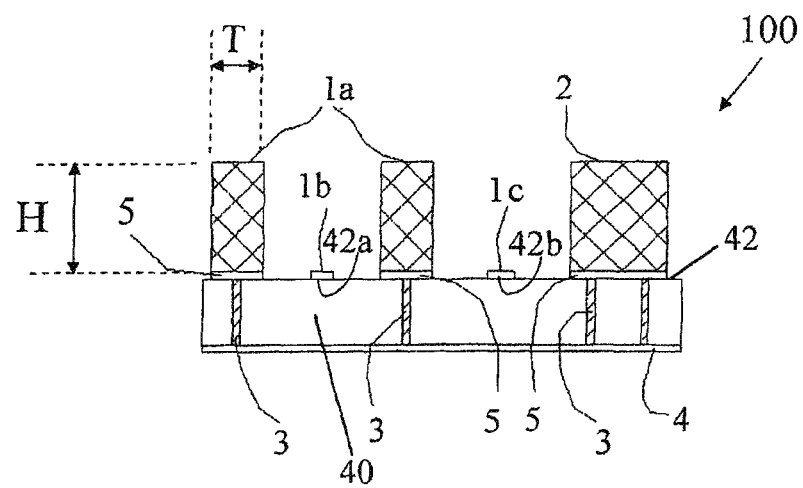
FIG. 1 is a side view of an implementation of a guard structure on a substrate according to an embodiment of the invention at a substrate-level.

FIG. 1 shows a support structure 100 for providing signal isolation between signal traces 1b, 1c. The support structure 100 has a substrate 40 having a mounting surface 42 comprising first areas 42a, 42b for hosting the signal traces 1b, 1c. In this example, the substrate is a piece of silicon wafer. The mounting surface 42 has one or more electrically conductive portions 5 coupled to a ground plane 4. The support structure 100 further includes a plurality of thread-like structures synthesized on the electrically conductive portions. The plurality of thread-like structures collectively define electrically conductive projections 1a, 2 upstanding from (i.e. extending transverse to) the mounting surface 42. In this example, the electrically conductive projections 1a, 2 form continuous wall-like structures that surround around the signal traces 1b, 1c. The walls are elongate parallel to the mounting surface. For example, it extends along with the length of the signal traces 1b, 1c. Typically, at least one electrically conductive portion 5 has at least 80% of its area covered by the electrically conductive projection 1a or 2. As shown in FIG. 1, the electrically conductive projections 1a, 2 completely cover the electrically conductive portions 5.

In this example, the electrically conductive portions 5 are the guard traces of a via-fence as shown in FIG. 1. The guard traces 5 are formed of a layer of metallic material selectively disposed on the surface 40. The support structure 100 has multiple vias 3 extending all the way through the substrate 40 ("through-vias") to form electrically conductive paths between the guard traces 5 and the ground plane 4.

In this example, the plurality of thread-like structures are formed by carbon nanotubes (CNTs) which are synthesized directly on the guard trace 5 by chemical vapor deposition. The resulting electrically conductive projections 1a, 2 have a high aspect ratio and a high surface-to-volume ratio which give rise to enhanced RF isolation among signal traces 1b, 1c. The aspect ratio (i.e. the ratio between height H and thickness T) of the electrically conductive projections 1a, 2 as shown in FIG. 1 is at least two, and preferably at least three.

In this example, each of the electrically conductive projections 1a, 2 is implemented on, i.e. has one end in direct physical contact with, one of the guard traces 5 and is positioned over the through-vias 4. The electrically conductive projections 1a, 2 extend away from the mounting surface 42 by a distance further than the distance that the signal traces 1b, 1c extend away from the mounting surface 42.

When in use, the through-vias 3 and guard traces 5 provide an electrical connection between the electrically conductive projections 1a, 2 and the ground plane 4. Thus, the support structure 100 is able to provide signal isolation in the upward/vertical direction through "channelizing" the signal traces 1b, 1c. This reduces the requirements for lateral isolation. In other words, the provision of the electrically conductive projections reduces the surface area and the number of through-vias required for via-fencing thus reducing the weight and increasing the density of the chip. Additionally, such structures with a high surface-to-volume ratio can also be used as an additional channel to facilitate heat dissipation thus complementing classical means of thermal management. In particular, the high surface-to-volume ratio of the thread-like structures facilitates convective heat transfer by spreading out the heat through its large surface area. Heat dissipation can be further enhanced by using thermal conductive thread-like structures, such as CNTs, so that heat can be transferred to the ground plane, for example by through-vias.

Figure 2:
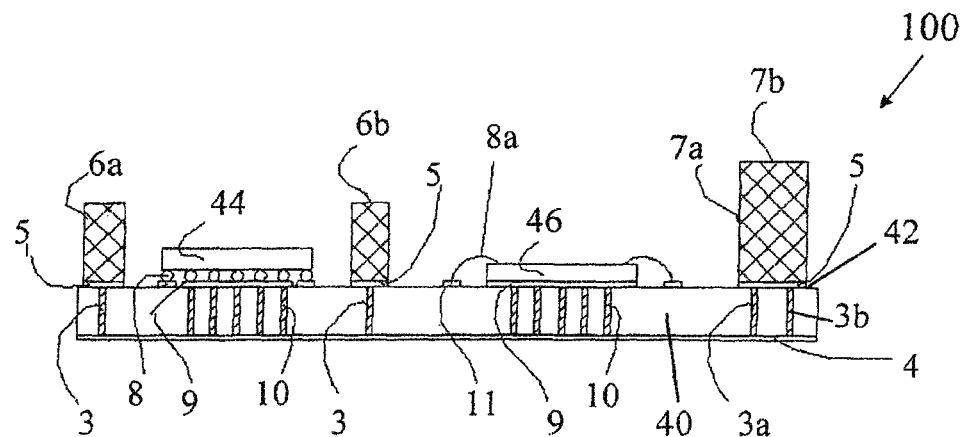
FIG. 2 is a side view of an implementation of a guard structure according to an embodiment of the invention on a multi-chip module (MCM) at a substrate-level.

FIG. 2 shows another support structure 100 for RF isolation at a substrate-level among electronic components such as ball grid array (BGA) integrated circuit (IC) 44 and a quad flat pack (QFP) 46 on a multi-chip module (MCM). Similar to the example shown in FIG. 1, the support structure 100 has a substrate 40 having a mounting surface 42 hosting the BGA IC 44 and QFP 46. The BGA IC 44 and QFP 46 are provided on the surface 42 of the substrate surface 40 via surface land pads 9. Additionally, metallized bumps 8, surface land pads 11, bonding wires 8a, and electrical and/or thermal interconnects 10, are provided to link the BGA 44 IC and QFP 46 as desired to build a Microwave Monolithic Integrated Circuits (MMIC) package for a particular application.

The mounting surface 42 of the substrate 40 has electrically conductive portions shown as guard traces 5. In this example, the guard traces 5 are formed of a layer of metallic material selectively disposed on the mounting surface 42. Multiple through-vias 3 form electrically conductive paths between the guard traces 5 and a ground plane 4. Some of guard traces 5 are coupled to a single row of through-vias 3, and some other guard traces 5 are coupled to two rows of through-vias 3a, 3b. The support structure 100 further has electrically conductive projections 6a, 6b, 7a formed by a plurality of thread-like structures (not shown) synthesized on guard traces 5 of the substrate 40. The electrically conductive projections 6a, 6b, 7a extend transverse (substantially perpendicular) to the mounting surface 42. In addition, the electrically conductive projections 6a, 6b, 7a extend away from the mounting surface 42 by a distance further than the distance that the BGA IC 44 and QFP 46 extend away from the mounting surface 42.

As shown in FIG. 2, each of the electrically conductive projections 6a, 6b, 7a is located directly over the corresponding through-vias 3, 3a, 3b for an improved conductivity and thus maximizing the isolation of the BGA IC 44 and the QFP 46 on the MCM at substrate level. In another example, the through-vias 3, 3a are lined with metallic material and the thread-like structures are additionally attached to the metallic lining of the through-vias 3, 3a.

When in use, the through-vias 3, 3a, 3b and guard traces 5 relay the electrical connection between the electrically conductive projections 6a, 6b, 7a and the ground plane 4. Thus, the elongate projections 6a, 6b, 7a of the fence-wall structure provide signal isolation between the two exemplary electronic components, BGA 44 and QFP 46 in the upward/vertical direction. Again, this reduces the requirements for lateral isolation. In particular, the provision of the fence-wall structure reduces the surface area and the number of through-vias required for via-fencing and leads to a reduced weight yet increased density of the chip. Additionally, such high aspect structures can also be used as an additional channel to facilitate heat dissipation thus complementing classical means of thermal management.

It will be understood by a person skilled in the art, the metallized bumps 8, bonding wires 8a, surface land pads 9, 11 and interconnect 10, are optional features of the invention. They merely illustrate possible connections within or between the electronic components 44, 46 provided as examples in this embodiment. It will also be understood that the electronic components 44, 46 are not limited to BGA ICs and QFPs. In addition, the planar layout of electrically conductive projections 6a, 6b, 7a of the support structure 100 can be designed to fully surround or encircle the electronic components 44, 46 or in part.

Figure 3:
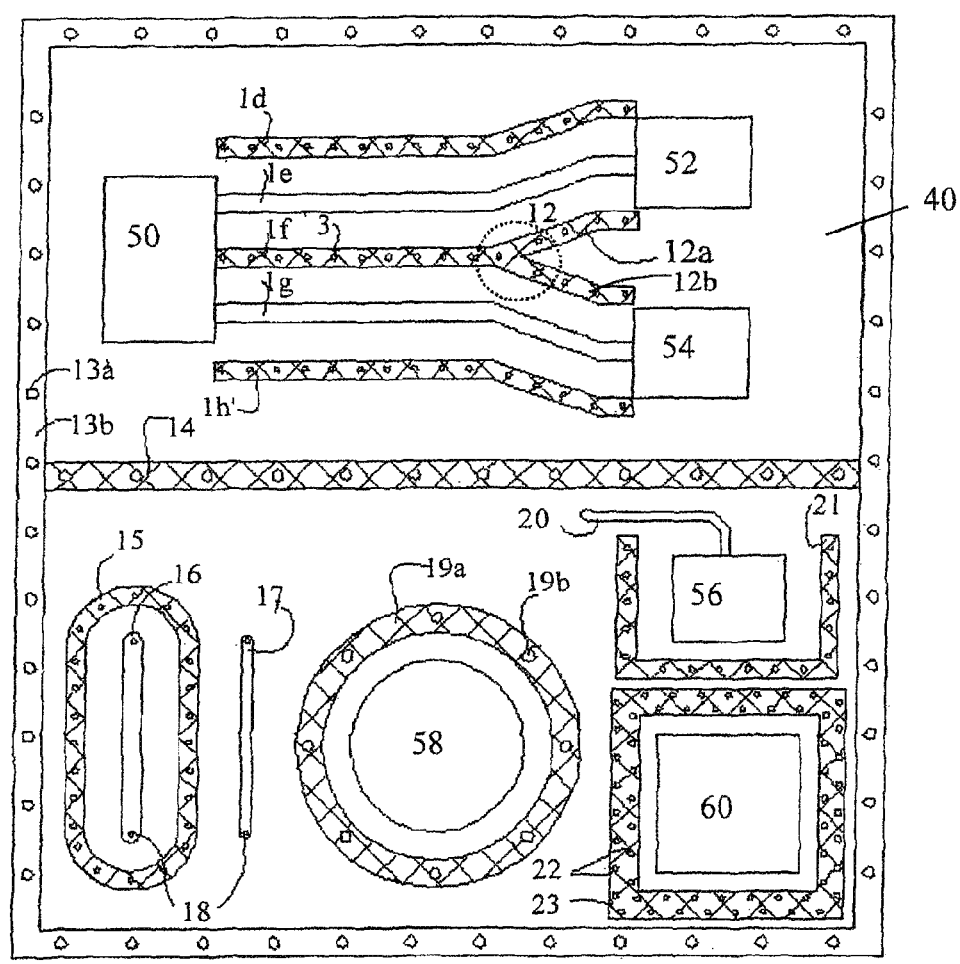
FIG. 3 is a global plan view of an implementation of a guard structure according to an embodiment of the invention between different electronic components at a package level and at a substrate level.

FIG. 3 gives a further example of the implementation of an electrical guard structure for signal isolation between different chips (ICs).

A substrate 40 hosts a plurality of chips or ICs 50, 52, 54, 56, 58, 60, and the relevant routing architecture 1e, 1g, 16, 17, 20. In this example, the substrate 40 is a PCB. Similar to previous examples, a plurality of electrically conductive projections are implemented on the substrate 40 as described below.

Depending on the routing design and the corresponding isolation requirement, some electronic components are fully compartmentalized by the fence-wall structure and others are not. In this particular example, chips 58, 60 are fully surrounded by electrically conductive projections 19a, 23 on the substrate 40. Similarly, routing architecture 16 is also fully surrounded by an electrically conductive projection 15 while being coupled to routing architecture 17 via an electrical or thermal interconnect 18 above or below the substrate. In this example, the routing architectures 16, 17 are placed in close proximity and form a pair for routing DC and AC signals, respectively. In another example, the pair of routing architecture 16, 17 route DC and RF signals, respectively. On the other hand, chip 56 is partially surrounded by the electrically conductive projection 21. It will be understood that the considerations for using the electrically conductive projections for a full or partial compartmentalization will depend on isolation requirements for each application.

Conduction lines 1e, 1g for connections between different chips 50, 52, 54 are isolated from each other by an elongate projection 1f disposed in between the conduction lines 1e, 1g. The electrically conductive projections 1d and 1h are provided along the other side of the conductions lines 1e, g respectively to provide further RF isolation. Accordingly, the electrically conductive projections 1d, 1f, 1h effectively "channelize" conduction lines thus restricting the signal distribution to the channelled space.

The electrically conductive projections 19a, 23, 15, 21, 1d, 1f, 1h form wall-like structures and are electrically connected to a ground plane by vias, for example, vias 3, 13a, 19b, 22. Each of the wall-like structures extends transversely from the mounting surface by a predefined height. The wall-like structures as shown in FIG. 3 have an elongate cross-section parallel to the mounting surface and a thickness perpendicular to the lengthwise direction of the elongate cross-section. Accordingly, the ratio of the height and the thickness defines the aspect ratio of the wall structure or the electrically conductive projection. Typically, the wall structure has an aspect ratio of at least 2.

As illustrated in FIG. 3, the wall structure may have a rectangular, circular or elliptical cross-section parallel to the mounting surface. It will be understood that the cross-section may take any other shapes depending on the isolation requirements. It is also noted that the top view of the support structure shows that wall structure 1f bifurcates into two segments 12a and 12b at a junction 12. The entire substrate 40 is further compartmentalized by providing an electrically conductive projection 14 between a first collection of electronic components including the chips 50, 52, 54 and the respective conduction lines 1e, 1g and a second collection of electronic components including chips 56, 58, 60 and the respective routing architecture 16, 17, 18, 20. This can be used for, for example, separating DC and RF functions and/or for isolating between two units responsible for transmitting and receiving signals, respectively. This again shows that the planar arrangement of the electrically conductive projections can come in various forms and it not limited to what has been described in the examples.

The plurality of thread-like structures can be formed by CNTs because the CNTs can be synthesized with a very high aspect ratio using existing surface micromachining techniques in microelectronic processes. The CNTs may be grown on the substrate under suitable conditions as will be discussed later in details. Since each of the electrically conductive projections is formed collectively by a collection of thread-like structures, the projections will have an elevated surface-to-volume ratio. Additionally, each of the CNTs can be formed as a hollow tube, which further increases the surface-to-volume ratio of the electrically conductive projections. This will lead to a remarkable improvement in their capability in absorbing stray radiation and providing robust RF isolation. Therefore, the integration of the electrically conductive projections formed of CNTs to the MMICs, as illustrated in this example, would clearly provide robust RF isolation compared to any existing technologies.

Figure 4:
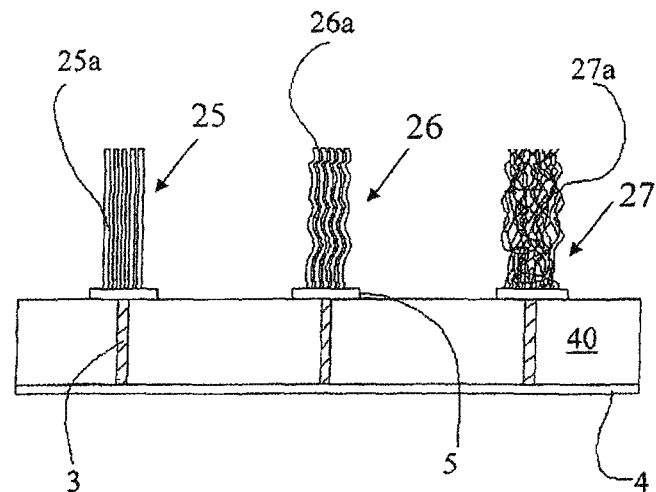
FIG. 4 is a side view of different configurations of the plurality of thread-like structures that can be used in accordance with the present invention.

FIG. 4 shows a side view of different configurations of the plurality of thread-like structures that can be used in accordance with the present invention. Each of the electrically conductive projections 25, 26, 27 is formed by the respective thread-like structures 25a, 26a, 27a. The configurations of the thread-like structures 25a, 26a, 27a are different but the respective projections 25, 26, 27 can be made to have the same height and a high aspect ratio of about 3.5.

As shown in FIG. 4, each of the thread-like structures 25a is substantially straight and extends upright from the substrate 40. On the other hand, each of the thread-like structures 26a has substantially the same wavy or curly configuration along its lengthwise direction so that the thread-like structures remain parallel to one another. A plurality of the thread-like structures 26a collectively form a projection 26 that is oriented in a generally upright direction. Due to the wavy/curly configuration of the filaments, the projection 26 has a higher surface-to-volume ratio than that of the projection 25. As a further example, the thread-like structures 27a are inter-twined with one and another in a random and mesh-like fashion, but each of them has substantially the same height to collectively form the projection 27 that is oriented in a generally upright direction.

Again, the thread-like structures in various configurations can be made by carbon nanotubes (CNTs). As noted earlier, CNTs can be formed with very a high aspect ratio and also a high surface-to-volume ratio. Therefore, CNTs is very suitable for use in the invention. Other materials of similar properties (e.g. electrically conductive, electrically absorptive, a high aspect ratio and/or high surface-to-volume ratio) may also be used, as will be appreciated by a person skilled in the art. Alternatively, the electrically conductive projection can also be made of any metallic material with high surface area and absorptive in nature. For example, a plurality of metallic thread-like structures can be grown on the substrate by techniques such as chemical vapour deposition.

Figure 5:
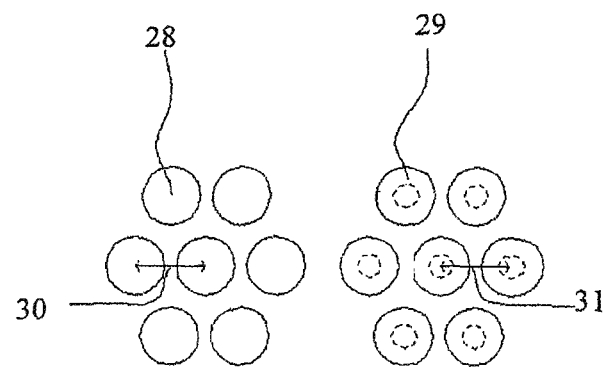
FIG. 5 is the plan view of different configurations of the plurality of thread-like structures that can be used in accordance with the present invention.

FIG. 5 shows the plan view of different configurations of the plurality of thread-like structures that can be used in accordance with the present invention. Specifically, the thread-like structures may be solid cylinders 28 or hollow tubes 29. In this example, the solid cylinders 28 and hollow tubes 29 in the respective bundle are arranged loosely in the shape of a hexagon. The distance 30, 31 between the centres of each individual thread-like structure can be determined by a known method. A plurality of thread-like structures can be synthesized with a pre-defined distance 30, 31 using known techniques and/or after routine experiments by a person skilled in the art.

Variations

The present invention is not limited to the arrangements of the electrically conductive projections shown in the figures. In all the figures and embodiments described, above, it is understood that the complexity and planar shapes of the electrically conductive projections and the configurations of the thread-like structure can be designed based on the routing and/or isolation requirements. In particular, the compartmentalization of the various electronic components may be in whole or in part.

As a skilled person would appreciate, the design of guard traces 5, 13b, ground plane 4 and the via-fences 3, 3a, 3b, 13a, 19b, 22 may be different from what are shown in the figures. For example, the guard trace, ground plane and/or the via-fence may be placed at a different location, and/or may have a different shape, size and/or structure. In particular, the guard trace 5 may be coupled to more than 2 rows of vias depending on specific isolation requirements. Typically, the guard trace is positioned on the same plane as the mixed-signal traces/circuits/packages. It can also be designed as a via catch pad. A via-fence is a series of metal-lined or metal-filled vias that extend through the substrate to form an electrical connection between the guard trace to the ground plane thereby providing RF isolation between electronic components in the lateral direction. A via-fenced guard trace is a common practice used on substrates for grounding. However, a skilled person would appreciate that a guard trace can be effectively grounded by means other than using a via-fence, for example, by connecting to a separate ground plane away from the substrate. Accordingly, the electrically conductive projections are in turn electrically grounded for effective signal isolation. Additionally, as a skilled person in the art would understand, the wall-like structures can be grounded in ways other than through via-fenced guard traces. For example, the wall-like structures can be synthesized directly on the surface of substrate, e.g. on a Si or $SiO_2$ wafer, and be grounded by connecting the wall-like structure to a ground plane, for example, to a ground plane on an adjacent substrate.

Further, the present invention is not limited to any particular types or functions of the chips (MMIC) 56, 58, 60 or the individual mixed-signal traces or ICs 50, 52, 54 around which the electrically conductive projections are implemented. Additionally, the present invention is not limited to any particular fabrication method of the MMICs/mixed-signal traces 50, 52, 54, 56, 58, 60 nor to the raw materials used to fabricate them. Clearly, there can be variations to the boundary of the substrate 40, including its shape, size and structure, and to the components mounted on the substrate 40.

For another example, the thickness of the electrically conductive projections in different parts of the substrate may be different. In particular, each of the electrically conductive projections may have a different thickness from another. For example, the projections 2 (FIG. 1), 7a (FIG. 2), 14, 19a, 23 (FIG. 3) are thicker than that the projections 1a (FIG. 1), 6a (FIG. 2), 1d, 1f, 1h, 15, 21 (FIG. 3), respectively. The thickness of a single electrically conductive projection may vary along a direction perpendicular to the mounting surface (i.e. along the height of the projection) or a direction parallel to the mounting surface (e.g. along the lengthwise direction of the wall).

For yet another example, the height of the projections may be different from one another. In FIG. 1, the projections 1a, 2 have the same height while in FIG. 2 the projections 6a, 6b may be shorter than projection 7b. It is understood that the height of the projections can be varied and will depend largely on the routing design and/or isolation requirements for different part of the substrate. Due to the provision of RF isolation in the vertical direction, the requirement for lateral isolation may be reduced. That means the density and size of through-vias 19b required can be adjusted accordingly.

The above examples describe an electrical guard structure or support structure that is able to significantly reduce the size of the guard trace as well as the number of through-vias required, which can give rise to remarkable improvement on circuit/package size compactness.

In additional, the present invention further propose fabrication methods of the support structure or electrical guard structure which integrates the fabrication of the electrically conductive projections into the process flow of IC package fabrication thereby enhancing the cost effectiveness of the process. This also gives circuit designers additional flexibility to implement such electrically conductive projection at the source of stray radiation, to achieve improved signal integrity.

As a particular example, the fabrication of the electrical guard structure in accordance with the invention will be described with respect to the use of the CNTs as the plurality of thread-like structures. A skilled person would understand that this example is not considered to be limiting to a particular technique in the process nor to CNTs as the thread-like structures. Other appropriate structures such as nanowires, nanofibers, or nanotubes made of materials that have a reasonable degree of electrical conductivity can be used to form the projections using suitable fabrication techniques which will be apparent to a person skilled in the art.

In the first step, a substrate having a mounting surface is provided. Such substrate is typically, but not limited to, silicon. The mounting surface has a first area for hosting the electronic component. The mounting surface is optionally provided with electrically conductive portions coupled to a ground plane.

The exemplary method further includes synthesizing a plurality of thread-like structures on the electrically conductive portions to collectively form the electrically conductive projections extending transverse to the mounting surface. The one or more electrically conductive projections include one or more wall-like structures which are elongate parallel to the mounting surface.

Specifically, such a substrate is can be provided by using standard microelectronic fabrication techniques for fabricating IC packages and a typical via-fence structure including guard traces, vias and a ground plane. That is, metallization of ground trace, signal trace or interconnects can be carried out by surface micromachining techniques used in microelectronic processes. The through-vias can be prepared the same way in which conventional interconnect vias or substrate-to-package vias are prepared.

The fabrication process of the plurality of thread-like structures can be integrated into the process flow of IC fabrication. Specifically, standard lithography techniques can be used to pattern the substrates to define the planar arrangement of electrically conductive projections on the substrate. The plurality of thread-like structures can be then fabricated by techniques used in microelectronics or wafer processing known to a person skilled in the art. Note that the electrically conductive projections can be made of a range of suitable materials and relevant techniques could be used to synthesize them directly over the substrate.

In the example of CNTs, a two-step process is typically used, namely, metallization and growth. The metallization process for CNT synthesis is a standard surface micromachining technique that can be carried out on the same process line as the metallization for signal traces, interconnects and/or guard traces. The guard traces are optionally prepared with catalyst particles for catalyzing the synthesis of the CNTs. After that, the growth step is carried out.

The CNTs can be synthesized with suitable parameters to achieve desired characteristics including the aspect ratio and a pre-defined configuration (e.g. multi-walled (such as triple walled), double-walled, single-walled, hollow tubular, or solid cylindrical). Optionally, the CNTs are made of carbon atoms together with other kinds of atoms to form a composite such as one made of carbon atoms infused with metals. This typically increases the overall electrical conductivity of the CNTs thereby enhancing the signal isolation capability of the guard structure. According to a particular example, the growth of the CNTs is performed by chemical vapour deposition. This technique can be employed using suitable temperatures, voltage bias, gas flow, partial pressures and time duration known to the person skilled in the art. The value of relevant parameters required for achieving desired characteristics can be ascertained by a person skilled in the art and/or through routine experimentations known to him.

Note that the above method demonstrates an advantage in fabrication process over the prior art. In particular, since the fabrication of the elongate projections only requires standard wafer processing techniques, it is more cost effective than the prior art in which mounting and alignment of metal walls are necessary. Furthermore, since the process can be integrated to that of the IC fabrication, it offers flexibility in directing the placement of the metallization layer for the electrically conductive projections at a nanometer or micrometer scale. In other words, the IC package can be designed to allow the electrically conductive projections to be implemented and targeted at the sources of stray radiation on the substrate/package thereby improving the effectiveness of the RF isolation. This flexibility in customizing the design of the guard structure based on routing design is achieved simply in an additional lithography step of patterning a catalyst layer for the growth of CNTs which can be optionally integrated to the step of forming guard traces on the substrate. The plurality of CNTs can be synthesized over the substrate before or after the various electronic components are fabricated/mounted on the substrate depending on the thermal budget of the process.

In applications with thermal budget constraints, (e.g. when there are certain working limits of the circuitry or electronic components, or where the substrate such as printed circuit board (PCB) or printed wiring board (PWB) is made of a material with low thermal tolerance such as polymer-based or thermal sensitive materials), it may not be feasible to fabricate the plurality of thread-like structures directly over the substrate by chemical vapour deposition. Therefore, alternative methods are proposed to implement the electrically conductive projections onto such substrate (the "target substrate") hosting electronic components mounted on its mounting surface without using excessive heat and high pressure. In other words, the methods below are applicable to target substrates made of any material such as, but not limited to, semiconductor (silicon, III-V), alumina or polymeric.

Method 1: 3D Printing

One alternative is to print the CNTs onto a target substrate from a liquid or viscous "concoction" containing CNTs that are uniformly dispersed therein.

For example, the concoction containing CNTs is obtained by transferring CNTs synthesized on a standard substrate into a solvent for dispersion known to a person skilled in the art, in which the synthesis of CNTs on the standard substrate can be carried out by chemical vapour deposition.

The sub-units (e.g. small segments) of CNTs are then deposited layer by layer onto the target substrate to form a desired layout of the CNT-based electrically conductive projections. Typically, an electrical potential difference is provided between the target substrate surface and the tip of the nozzle to maintain the CNTs in the upright direction. Specifically, an electric field is at least provided between the top end of CNTs and the tip of the nozzle so that the CNTs and the resulting electrically conductive projection can be produced with a high aspect ratio. Due to the layer-by-layer printed structure, a cross-link or overlap may exist between individual nanotubes and the cross-link can be enhanced by Van der Waals forces and stiction.

Note that the solvent may or may not be removed from the concoction during the printing. Accordingly, it may or may not result in a by-product. Depending on the nature of the concoction (e.g. polarity, dielectric constant), the curing of the CNTs may not require an external source of energy, such as heat or light.

Using such 3D printing techniques, the CNTs can be formed on a rigid or flexible surface. Also, the resulting electrically conductive projections can be obtained with thicknesses depending on design requirements. The resolution of the printed pattern is subjected to the state of the art 3D printing techniques, viscosity of the 'concoction' and/or the nozzle design. The surface tension between the concoction and the printed surface can be adjusted to maintain the desired structure.

Optionally, the formation of the metallization such as signal traces, ground guard trace, interconnects can be carried out by printing, too and such techniques are known to a person skilled in the art. Similarly, through-vias can also be prepared by laser processing techniques such as laser printing depending on the type of substrates.

The implementation of CNTs, including the laser processing step, can be carried out before or after the various electronic components are fabricated/mounted on the substrate, at a package level. At a substrate level, the printing of CNTs is carried out after the via-fenced guard trace is prepared.

The advantage of this method is that a sacrificial substrate would not be required for the implementation of the CNT on materials/substrates having low thermal tolerance. A drawback is that the repetitive step of printing layer by layer, which could be relatively more time consuming. The high aspect ratio of the CNTs and the resulting electrically conductive projections as described earlier could still be achieved due to the electrical field imposed during the printing process.

Method 2: Transfer Bonding

An alternative method involves joining the electrically conductive projections of another substrate onto the mounting surface of the target substrate or the electrically conductive projections on the mounting surface.

The exemplary method includes providing a second substrate carrying a plurality of thread-like structures on its major surface. The thread-like structures collectively form electrically conductive projections extending upright from that major surface.

The exemplary method further includes joining a free surface of the electrically conductive projections to a pre-defined area of the mounting surface of the target substrate such that the one or more electrically conductive projections are transverse to the mounting surface and are electrically connected to a ground plane of the target substrate. The one or more electrically conductive projections include one or more wall-like structures which are elongate parallel to the mounting surface.

Prior to joining the electrically conductive projections to the mounting surface, an appropriate amount of conductive epoxy (as conductive glue) can be deposited on the pre-defined area. In one example, the method includes depositing the conductive epoxy on the guard trace and then adhering the electrically conductive projections to the guard trace. The conductive epoxy can be CNT based or even metal based (such as Au or Ag based) material. Depending on the nature of the conductive epoxy, a curing step may be required for bonding the CNTs to the guard trace (which is typically metallic). For example, the conductive epoxy can be cured by air, UV light, or heat, as appropriate. For certain types of conductive epoxy, the curing step can be performed at a low temperature condition, such as at ambient temperature (typically below 50° C., and preferably below 30° C.).

The conductive glue can be dispensed onto the pre-defined area using any dispensing techniques such as by a needle or syringe, either manually or using an automated tool. The volume of each drop of the conductive glue depends on its viscosity, the dispensing volume and the inner diameter of the needle.

In another example, the conductive glue is printed onto the pre-defined area using techniques akin to digital printing. In other words, the layout of the conductive glue to be printed (which normally follows the layout of the guard trace to be joined with the electrically conductive portions) can be precisely controlled. Thus, a very fine resolution can be achieved by the printing as compared to by dispensing. In particular, the resolution depends on, for example, the nozzle size, viscosity of the conductive glue and surface tension between the glue and the printing surface (e.g. the substrate or the guard trace thereon).

The conductive glue in the above examples can be made of any conductive "concoction"—a solvent with Au, Ag, CNTs or any other conductive composites or nanoparticles.

According to a particular example, a plurality of CNTs are first grown on a standard substrate and then get transferred onto a transfer substrate by a flip-chip bonder, and are released from the standard substrate. The transfer substrate may be made of a material with a low glass-liquid transition temperature so that the material will be hardened by either heating or cooling from its initial fluid form, in order for the CNTs to be attached. In this example, the transfer substrate is polymeric.

The transfer substrate may be a sacrificial substrate. In that case, the plurality of CNTs will be joined to the predefined area on the target substrate after a further round of flip-chip bonding using, for example, thermo-compression or ultra-sonic bonding. This can be carried out before or after the electronic components or signal traces are mounted on the target substrate. The sacrificial substrate is then subsequently removed, for example, by reactive ion etching. Both the bonding and etching procedures are known to a skilled person in the art and suitable parameters associated with the procedures can be ascertained through routine experimentation known to the person skilled in the art. For example, standard techniques and apparatus that used for chip to chip bonding, or chip to package bonding such as BGAs and interconnects, can be used. The resultant substrates or packages are as shown previously in FIGS. 1-5. In this example, although alignment between the plurality of CNTs and the predefined area of the target substrate is required before bonding, the overall assembly process remains cost-effective as compared to the prior art. In particular, the steps of alignment and bonding can be carried out using standard microelectronic techniques, and therefore they can be integrated into the same process line with that of IC fabrication. In other words, no separate process line or mounting instruments are required unlike the conventional techniques of mounting metallic castings to the substrate. In addition, very fine resolution can be achieved with the flip-chip bonder. This advantage is not available in instruments for mounting metallic castings.

Alternatively, the transfer substrate can be the target substrate provided with desired circuits and components. In particular, the electrically conductive projections of the standard substrate are joined directly to the pre-defined area of the mounting surface of the target substrate by flip-chip bonding. In this example, the target substrate is polymeric.

In a particular example, at least a portion of the pre-defined area of the target substrate has a second plurality of thread-like structures which collectively define further electrically conductive projections extending transverse to the first surface prior to the step of joining. Optionally, the second plurality of thread-like structures are synthesized on the first substrate itself. Therefore, during the step of joining, the electrically conductive projections on the standard substrate may be selectively joined end-by-end with those further electrically conductive projections on the target substrate. Therefore, the electrically conductive projections additionally function as structural support for a three-dimensional stack package. Since the bonding between the electrically conductive projections, does not require heat and high pressure, physical damages that could affect the working characteristics of the electronic components are reduced.

According to a further example, the electrically conductive projections are joined to a surface of the target substrate which is opposite to the mounting surface. Specifically, the electrically conductive projections can be joined to a ground plane of the target substrate. In a further optional step, the electrically conductive projections are joined to another target substrate on a pre-defined area on its mounting surface of the further target substrate. Similarly, the bonding procedure is carried out using a flip-chip bonder known to a person skilled in the art.

Figure 6:
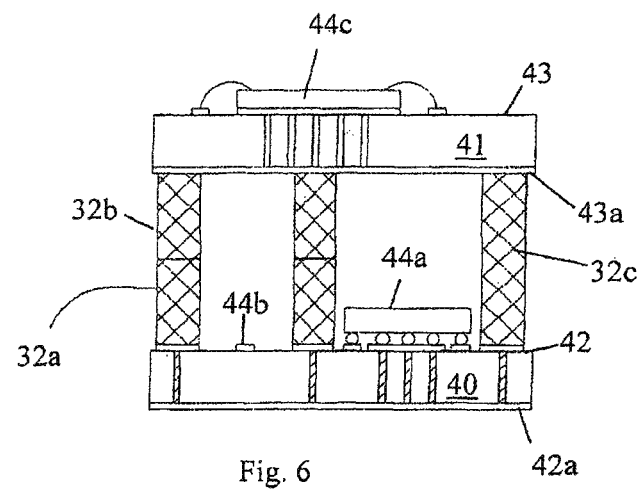
FIG. 6 shows a variation in the implementation of a guard structure on a substrate according to further embodiment of the invention.

FIG. 6 shows a variation in the implementation of a guard structure on a substrate, which may be formed by the methods described above.

A first substrate 40 has electrically conductive projections 32a and an electronic component 44a and signal trace 44b on the mounting surface 42. A first ground plane is provided on a surface 42a opposite to the mounting surface 42.

A second substrate 41 hosts an electronic component 44c on a major surface 43 and the electrically conductive projections 32b attached to a second ground plane provided on an opposite surface 43a. The electrically conductive projection may be synthesized directly over the substrate 41 or transferred from a transfer substrate as discussed earlier.

Figure 7A:
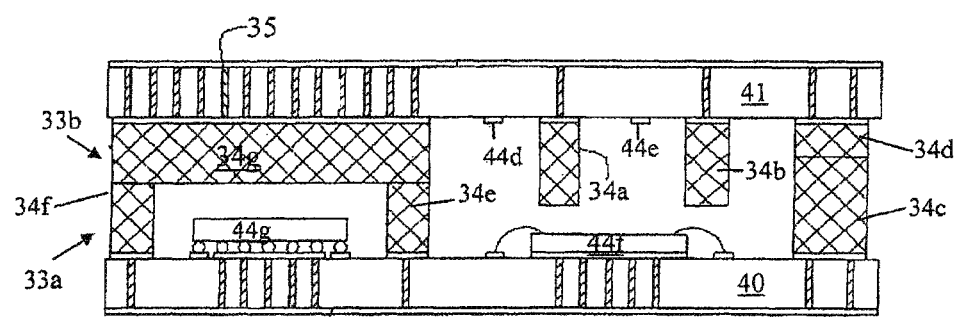
FIG. 7(a) shows another variation in the implementation of a guard structure on a substrate according to an embodiment of the invention.

The electrically conductive projections 32a, 32b on each of the first and second substrates 40, 41 can be brought into alignment and joined at the respective free surface of the projections 32a, 32b so that the projections 32a, 32b are sandwiched between the two substrates 40, 41. The electrically conductive projection 32a on the first substrate 40 can be connected to the electrically conductive projection 32b on the second substrate 41 as a result of Van der Waals forces and stiction. The Van der Waals interactions and stiction are further enhanced for an electrically conductive projection with an elevated surface-area-to-volume ratio, such as one formed of thread-like structures 26a, 27a, as compared to one formed of thread-like structures 25a. Optionally, additional bonding adhesive can be applied to improve the mechanical interconnection between the interface of the electrically conductive projections [6]. Note that in this example, the planar arrangement of the projections 32a, 32b on each of the substrates 40, 41 mirrors each other exactly. However, this is not essential (see the subsequent example as shown in FIG. 7(a)). For example, the projections 32a, 32b can be formed as a single projection carried by either of the substrate 40, 41 and then are bonded to the other substrate 41, 40. In that case, the single projection 32c is directly connected to the ground planes on both substrates 40, 41.

In this way, a 3-dimensional package comprising a stack of the first and second substrates 40, 41 with their respective electronic components 44a, 44c and the signal trace 44b, is formed. The two substrates 40, 41 together with the electrically conductive projection 32a, 32b disposed in between collectively form one or more compartments for signal isolation of the electronic components or signal traces in adjacent compartments. The three dimensional stack package offers more robust RF isolation whose range extends from the first substrate 40 upward till the first substrate 41. Both substrates 40, 41 are connected to their respective ground plane provided on surface 42a or 43a. In addition, two sides of each substrate can be used for additional packing density. For example, the surfaces 42a, 43 of the 3-dimensional package can be bonded to other additional substrates through similar electrically conductive projections.

FIG. 7(a) shows another variation in the implementation of a guard structure on a substrate according to an embodiment of the invention.

Different from the example shown in FIG. 6, the second substrate 41 in this case hosts the signal traces 44d, 44e and the electrically conductive projections 33b on the mounting surface of the substrate 41. The electrically conductive projection may be synthesized directly over the substrate 41 or transferred from a transfer substrate as discussed earlier. The second substrate 41 is then flipped over so as to join its electrically conductive projections 33b with the electrically conductive projections 33a of the first substrate 40. The planar area and location of the projections does not have to be in a mirrored configuration. That is, one or more of the projections in the first substrate 40 may not have the respective counterpart projections of the same size at the corresponding location on the second substrate 41. For example, the projections 34a, 34b on the second substrate 41 are not in contact with any projections on substrate 40, while the projection 34c of the first substrate 40 is in full contact with the elongate projection 34d of the second substrate 41. Yet in some other cases, selective portions of the projection 34g of the second substrate 41 are in contact with two projections 34e, 34f of the first substrate 40. The electrically conductive projections implemented in the three dimensional package can be used for the additional purpose of thermal management.

In the three dimensional stack package formed by the first and second substrates 40, 41, some of the electronic components, e.g. 44g are surrounded by the projections 34f, 34e on both sides in the lateral direction. The top surface (i.e. opposite to the mounting surface of the electronic component 44g) of the electronic component 44g is additionally shielded by projection 34g of the second substrate 41. Signal traces 444, 44e are isolated from each other by two pairs of projections, i.e. 34g, 34a and 34a, 34b disposed to the two sides in the lateral direction.

As noted earlier, the number of vias 35 for via-fencing may be accordingly reduced in view of the provision of multiple electrically conductive projections. The overall design requirements of the via-fence and electrically conductive projections will also depend on desired routing design and/or RF isolation requirements. For example, the distance between the two substrates 40, 41 also depends on the height of the projections, the routing design and RF isolation requirements.

Figure 7B:
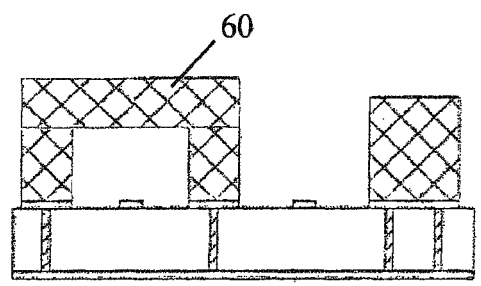
FIG. 7(b) shows a further variation in the implementation of a guard structure on a substrate according to an embodiment of the invention.

FIG. 7(b) shows another example of the guard structure formed when the transfer substrate is a sacrificial substrate that is subsequently removed. With the optional projection 60, this structure can be used for routing a signal or forming a channel or waveguide structure depending on isolation needs.

It will be apparent to a skilled person that the electrically conductive projections of the guard structure or support structure described above can be made by one or more of the techniques described: growing, 3-D printing and transfer bonding.

For example, the electrically conductive projections in the structures as shown in FIGS. 6, 7(a) and 7(b) can also be produced by printing as described in method 1 above. Alternatively, selective suppression of CNT growth can be used to obtain CNT-based projections of a pre-defined height. This can be done in a standard microelectronics process.

The signal isolation capability of the support or guard structure can be further improved by maximizing the overall electrical conductivity of the electrically conductive projections. Examples illustrated below demonstrate how the electrical conductivity can be maximized. Each of them may be used individually, or combined with one and another to achieve the purpose.

Figure 8:
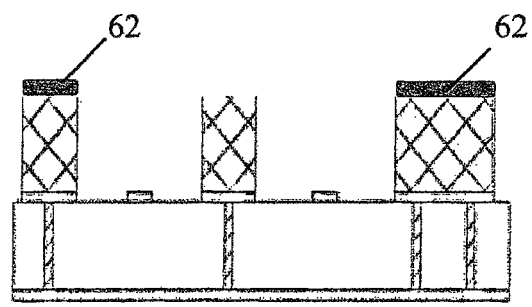
FIG. 8 shows a further variation in the implementation of a guard structure on a substrate according to an embodiment of the invention.

In the first, example, a layer of conductive material can be formed on the top surface of the electrically conductive projections. Referring to FIG. 8, a layer of conductive fluid is deposited on top of the CNT-based electrically conductive projections and subsequently cured to form a conductive layer 62. Such conductive fluid may include metallic fluid such as silver paint or silver paste. Other examples include suspension, of silver flakes, silver nano-particles, or a composite consisting of conductive and/or ferro-magnetic particles, including CNTs or graphene ink. In principle, any solvent can be used provided it is able to disperse the nano-particles or composite material within the solvent for ease of application and curing. Curing temperatures could range between 25-150° C. with or without a light source (UV), depending on thermal budget of subsequent processes or circuitry. For example, silver paint or silver paste can be cured at a temperature below 50° C.

The conductive fluid (before curing) can be maintained at the top of the CNT-based projections by managing the viscosity of the fluid. CNTs are typically hydrophobic and have measured contact angles between 90-150°. Due to the tubular nature of nanotubes, the roughness on the top surface of the CNT-based projections could follow a Cassie to Wenzel transition depending on the surface tension of the fluid. For highly viscous metallic fluid, due to the high surface tension between the liquid and the CNT interface, the metallic layer would remain on top of the CNT-based projections. For water-based fluids (polar) with lower surface tension, the conductive fluid could infiltrate into the bulk of the CNT-based projections. Due to the close proximity of adjacent tubes, capillary effect could lead to typically irreversible stiction between CNT bundles due to Van der Waals forces, which increase the packing density of the CNT-based projections. This also enhances the strength and stability of the CNT-based structure mechanically.

Alternatively or additionally, the overall electrical conductivity of the electrically conductive projections can be enhanced by increasing the electrical conductivity of the projections. For example, the method further includes infusing the CNT-based projections with metals or other conductive material. This can be done by, for instance, reflow soldering of a "conductive concoction" into the CNT-based projections. In this process, the metallic material can be infused into the bulk of the CNTs. Agglomeration of the CNTs may result to form a more compact structure with improved electrical conductivity.

In a further example, post treatment processes may be applied to the electrically conductive projections which are chemically functionalized with activating sites for attaching metal particulations thereto.

Advantages of the Invention

The present invention complements the existing technologies by providing a structure for isolating RF radiation in the vertical direction. This is achieved by the electrically conductive projections which extend transversely to the mounting surface. The structure can be implemented at both the substrate-level and package-level.

This invention additionally provides a fabrication process improvement to the existing technologies by integrating the synthesis of the plurality of thread-like structures which form the electrically conductive projections into microelectronic processes. This allows circuit designers to increase packing density at both substrate- and package-level without sacrificing isolation requirements. Typically, the electrically conductive projection can be formed with an aspect ratio of greater than 2. Such projections can be readily made from, for example, carbon nanotubes.

As discussed earlier, CNTs are one of the preferred examples to be used in this invention. CNTs of suitable electrical conductivity behave like a metal and therefore reflect stray propagation away from signal traces. Electrically conductive projection made of plurality of CNTs makes it resemble a sponge, i.e. with a high porosity and high density. Such structures could absorb radiation and at the same time lead to multiple reflections among the CNTs of the projection. This dual-effect contributes to a robust isolation capability.

Furthermore, the electrically conductive projections structure may serve the additional purpose of facilitating thermal management, i.e. act as an additional channel for heat dissipation. The elevated surface-to-volume ratio greatly improves heat extraction to the main heat sink, which is especially important for three-dimensional/multilayer packages. The signal integrity is expected to be further enhanced by an improved thermal management.

The advantages of this invention over existing technologies can be broadly categorized into the following three aspects, namely, easy implementation, size compactness, and cost effectiveness. The advantages of specific embodiments are also discussed below, 1. Easy Implementation The electrically conductive projections can be synthesized by techniques used in standard microelectronics processes with additional masks sets. As such, there is enhanced flexibility in placement of the electrically conductive projections with respect to the substrates or chips. In particular, the projections can be synthesized directly over the substrate, for example, by a bottom up approach, and be customized to surround the circuit/package design. The synthesis process can be integrated in the same assembly line and/or at the same time as the circuits/packages are built. This means that isolation requirements can be targeted at the source of stray radiation and that EMI/EMC solutions can be taken into account at the design phase, rather than the packaging phase. This in turn provides designers with additional flexibility in routing design.

The proposed fabrication method is different from the existing technologies because the conventional metallization techniques used in microelectronics processes are not able to attain a metallization with an aspect ratio of two or more. This is especially a prevalent problem that needs to be addressed for tightly coupled signal traces and or packages for future MMIC packaging.

Advantageously, customized or tuneable physical characteristics of the electrically conductive projections can be easily obtained in this invention, such as an aspect ratio of 20 or higher. This is achieved by controlling the properties of the plurality thread-like structures during the synthesis, for example, the size of individual threads, the height and density of the threads. For example, CNTs can be made of a diameter ranging from nano-meter to submicron scales, and with various configurations to further increase the surface-to-volume ratio. This is because the individual CNTs have a high surface-to-volume ratio and that they can be made of a hollow tubular structure [5], [7].

2. Size Compactness

The electrically conductive projections can be viewed as an extension of the ground trace in the vertical upward direction. The high aspect ratio of the projections provides vertical isolation in routing architectures with tight space constraints through "channelizing" signal traces and ICs.

As a result of this vertical isolation, the size requirements on guard traces for lateral isolations to be reduced. In particular, the requirement for the lateral spread of guard traces and the number of through-vias required can be reduced in order to achieve an equivalent signal integrity compared to the current technologies. Accordingly, the present invention allows the size requirements to be optimized depending on isolation requirements and downscaling is no longer constrained by the current design rules.

In addition, compared to conventional metal castings or walls, the size and weight of the electrically conductive projections are significantly reduced with the present invention.

In summary, the ability to use substrate area more efficiently will significantly improve the chip density while being able to meet adequate isolation requirements.

Secondly, since isolations requirements are now considered at the routing architecture design step, instead of the packaging step, packaging constraints are significantly lessened. For example, space allowance required for post-mounting metal castings and screen-walls can be reduced, thus further increase size compactness. In a preferred example, the thickness of the electrically conductive projections is also much smaller than the minimum allowable thickness of metal sheets used as screen-walls in current technologies.

In all, these flexible design considerations make it possible to have more complex but optimized, routing architectures not achievable by the existing technologies. This maximizes space utility in circuit/package design and, hence, leads to overall weight reduction and eventual downscaling of package size.

3. Cost Effectiveness

An increased degree of design freedom in the routing architecture means shorter and optimized routing of conduction lines. Thus, reduced material costs and an improved packaging density can be expected.

As explained earlier, the provision of the projections decreases the required lateral spread of the guard trace. Also, the number of metal-lined or metal-filled vias that need to be populated within the guard trace is reduced, thereby decreasing material and processing costs. At the same time, enhanced signal integrity, reduced losses and noise can be achieved.

A process integration of the synthesis of the projections and the fabrication of the ICs leads to a reduction of infrastructure/equipment costs. In other words, post-assembly processes such as the precision alignment of metal castings can be minimized or completely eliminated.

Last but not least, an effective routing architecture, better real estate management, the advantage of process integration and optimization makes it possible to obtain an IC package with further a reduced size and weight using a cost effectiveness fabrication process that is superior to the prior art.

REFERENCES

1. Curran, B., et al. *Novel multimodal high-speed structures using substrate integrated waveguides with shielding walls in thin film technology in Advanced Packaging and Systems Symposium,* 2008. *EDAPS* 2008. *Electrical Design of* 2008.
2. Ponchak, G. E., et al., *The use of metal filled via holes for improving isolation in LTCC.* Advanced Packaging, IEEE Transactions on, 2000. 23(1): p. 88-99.
3. Bahl, I. J., *Lumped elements for RF and microwave circuits* 2003, Boston: Artech House, p. 290-298.
4. Suntives, A., A. Khajooeizadeh, and R. Abhari. *Using via fences for crosstalk reduction in PCB circuits.* 2006. Portland, Oreg.
5. Chung, D. D. L., *Electromagnetic interference shielding effectiveness of carbon materials.* Carbon, 2001. 39(2): p. 279-285.
6. Yap, C. C., et al. *Characterization of CNT interconnection bumps implemented for* 1*st level flip chip packaging.* 2011. Singapore.
7. Chung, D. D. L., *Carbon materials for structural self-sensing, electromagnetic shielding and thermal interfacing.* Carbon, 2012. 50(9): p. 3342-3353.

The invention claimed is:

1. An electrical guard structure for providing signal isolation comprising:
    a substrate having a mounting surface comprising a first area for hosting at least one electronic component; and
    one or more electrically conductive projections implemented onto the substrate, the one or more electrically conductive projections extending transverse to the mounting surface of the substrate;
    wherein the one or more electrically conductive projections are formed by collections of a plurality of thread-like structures, the thread-like structures collectively defining the one or more electrically conductive projections extending transverse to the mounting surface;
    wherein the one or more electrically conductive projections include one or more wall-like structures;
    wherein the one or more wall-like structures are elongate parallel to the mounting surface;
    wherein the one or more electrically conductive projections have an aspect ratio of at least 2;
    wherein the mounting surface has one or more electrically conductive portions and the thread-like structures are provided on the one or more electrically conductive portions;
    wherein the one or more electrically conductive projections are coupled to a ground plane on a surface of the substrate opposite to the mounting surface by providing a plurality of vias extending through the substrate; and
    wherein ends of the thread-like structures distal to the mounting surface define a surface of the one or more wall-like structures, the electrical guard structure further comprising an electrically conductive layer on the surface of the one or more wall-like structures.

2. The electrical guard structure according to claim 1, wherein the diameter of the thread-like structures ranges from 0.01 nanometer to 500 nanometers.

3. The electrical guard structure according to claim 1, wherein the one or more electrically conductive portions are formed by a layer of electrically conductive material selectively provided on a portion of the mounting surface of the substrate.

4. The electrical guard structure according to claim 1, wherein the one or more electrically conductive projections are positioned over the vias.

5. The electrical guard structure according to claim 1, wherein the thread-like structures comprise nanowires, nanofibers or nanotubes.

6. The electrical guard structure according to claim 1, wherein at least one of the electrically conductive portions has at least 80% of its area being covered by the electrically conductive projections.

7. The electrical guard structure according to claim 1, wherein the electrically conductive projections extend away from the mounting surface by a distance further than the distance that the at least one electronic component extends away from the mounting surface when the at least one electronic component is hosted on the first area.

8. The electrical guard structure according to claim 1, wherein the one or more electrically conductive projections are positioned surrounding the first area.

9. The electrical guard structure according to claim 1, wherein the mounting surface comprises a second area for hosting a second electronic component, at least some of the one or more electrically conductive projections being positioned between the first and second areas.

10. The electrical guard structure according to claim 1, wherein the one or more electrically conductive projections are arranged to define a channelled space and to restrict signal distribution to the channelled space.

11. The electrical guard structure according to claim 1, wherein the plurality of thread-like structures comprise carbon nanotubes (CNTs).

12. The electrical guard structure according to claim 11, wherein the CNTs are single-walled.

13. The electrical guard structure according to claim 1, wherein the one or more electrically conductive projections have an aspect ratio of at least 3.

14. The electrical guard structure according to claim 13, wherein the one or more electrically conductive projections have an aspect ratio of at least 5.

15. The electrical guard structure according to claim 1, wherein each of the wall-like structures has a length in a lengthwise direction and a thickness perpendicular to the lengthwise direction; wherein the ratio of the length and thickness is greater than 2.

16. The electrical guard structure according to claim 15, wherein each of the wall-like structures extends transversely from the mounting surface by a predefined height, the ratio of the height and the thickness being greater than 2.

17. The electrical guard structure according to claim 15, wherein the ratio of the length and thickness is greater than 2.5.

18. The electrical guard structure according to claim 17, wherein the ratio of the length and thickness is greater than 3.

19. The electrical guard structure according to claim 18, wherein the ratio of the length and thickness is greater than 4.

* * * * *

UNITED STATES PATENT AND TRADEMARK OFFICE
CERTIFICATE OF CORRECTION

PATENT NO. : 9,991,209 B2
APPLICATION NO. : 15/034679
DATED : June 5, 2018
INVENTOR(S) : Dunlin Tan et al.

Page 1 of 1

It is certified that error appears in the above-identified patent and that said Letters Patent is hereby corrected as shown below:

On the Title Page

In the "Applicants" section, the second Applicant should read:
CNRS - CENTRE NATIONAL DE LA RECHERCHE SCIENTIFIQUE Signed and Sealed this
Twenty-eighth Day of August, 2018

Andrei Iancu
*Director of the United States Patent and Trademark Office*